(12) United States Patent
Ozawa et al.

(10) Patent No.: US 6,504,439 B1
(45) Date of Patent: Jan. 7, 2003

(54) VOLTAGE CONTROLLED OSCILLATION CIRCUIT HAVING OSCILLATION FREQUENCY VARIABLE CONTROL UNITS INSERTED BETWEEN INVERSION CIRCUIT ELEMENTS

(75) Inventors: Naoki Ozawa, Kawasaki (JP); Hiroaki Tani, Kawasaki (JP); Kenichi Nomura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 600 days.

(21) Appl. No.: 09/025,735

(22) Filed: Feb. 18, 1998

(30) Foreign Application Priority Data

Jul. 2, 1997 (JP) .............................................. 9-177204

(51) Int. Cl.$^7$ ................................................ H03B 5/24
(52) U.S. Cl. ..................................... 331/57; 331/177 R
(58) Field of Search ........................... 331/34, 57, 173, 331/177 R; 327/277, 281

(56) References Cited

U.S. PATENT DOCUMENTS

| | | | | |
|---|---|---|---|---|
| 5,365,204 A | * | 11/1994 | Angiulli et al. ................ | 331/57 |
| 5,465,063 A | * | 11/1995 | Fukuda et al. ............... | 327/512 |
| 5,487,093 A | | 1/1996 | Adresen et al. ............. | 375/376 |
| 5,544,120 A | | 8/1996 | Kuwagata et al. .......... | 365/222 |
| 5,568,099 A | | 10/1996 | Du .............................. | 331/57 |
| 5,594,391 A | * | 1/1997 | Yoshizawa .................... | 331/57 |
| 5,619,170 A | | 4/1997 | Nakamura .................. | 331/1 A |
| 5,638,014 A | | 6/1997 | Kurita ........................ | 327/141 |
| 5,657,359 A | | 8/1997 | Sakae et al. ................. | 375/376 |
| 5,673,005 A | * | 9/1997 | Pricer ........................... | 331/57 |
| 5,708,396 A | | 1/1998 | Mizuno ........................ | 331/57 |
| 5,982,836 A | | 11/1999 | Sakae et al. ................. | 375/376 |

FOREIGN PATENT DOCUMENTS

| | | |
|---|---|---|
| DE | 195 29 625 | 2/1996 |
| EP | 0 621 689 | 10/1994 |
| EP | 0 805 553 | 11/1997 |
| JP | 60-80316 | 5/1985 |
| JP | 60-163524 | 8/1985 |
| JP | 8-186490 | 7/1996 |

OTHER PUBLICATIONS

European Patent Office Communication for European Patent Application No. 98301197 including European Search Report dated Dec. 18, 2000.

* cited by examiner

*Primary Examiner*—David C. Mis
(74) *Attorney, Agent, or Firm*—Armstrong, Westerman & Hattori, LLP (57) ABSTRACT

A voltage controlled oscillation circuit with an oscillation frequency thereof controlled in accordance with an external voltage is disclosed. An odd number of inversion circuit elements such as inverters for inverting output signals thereof with respect to input signals thereto are connected in series with each other. An output side of the last-stage one of the odd number of the inversion circuit elements is connected to an input side of the first-stage one of the inversion circuit elements to thereby cause an oscillation. A plurality of oscillation frequency variable control units such as variable resistor circuit elements for changing an oscillation frequency in accordance with an external voltage are each inserted between each set of adjacent inversion circuit elements. A plurality of fixed resistor circuit elements each having a fixed resistance value are connected in parallel with a plurality of the oscillation frequency variable control units, respectively. The functions of both the variable resistor circuit elements and the fixed resistor circuit elements can be carried out at the same time by the use of a depletion type transistor or a transistor of a short channel type.

7 Claims, 8 Drawing Sheets

VOLTAGE CONTROLLED OSCILLATION CIRCUIT HAVING OSCILLATION FREQUENCY VARIABLE CONTROL UNITS INSERTED BETWEEN INVERSION CIRCUIT ELEMENTS

BACKGROUND OF THE INVENTION

1. Field of the Invention

The present invention relates to a voltage controlled oscillation circuit in which an oscillation frequency is controlled in accordance with an external analog voltage. A voltage controlled oscillator including this type of a voltage controlled oscillation circuit is widely used as a clock oscillator for an analog phase locked loop (PLL) oscillator.

The analog PLL oscillator has the function of multiplying a clock frequency and adjusting a skew of a rising or falling edge of a clock in an LSI, and has recently shown a tendency to provide a circuit (a so-called macro circuit) which is essential for realizing a high-speed LSI (large-scale integrated circuit) having a large size.

The present invention concerns a voltage controlled oscillation circuit making up an analog PLL oscillator as mentioned above, in which oscillation can be accomplished in a stable fashion regardless of the input voltage level.

2. Description of the Related Art

For facilitating an understanding of the problem of the conventional voltage controlled oscillation circuit, an exemplary configuration and the operation of a conventional voltage controlled oscillation circuit will be described below with reference to FIGS. 1 and 2 that will be described in "Brief Description of the Drawings".

Figure 1:
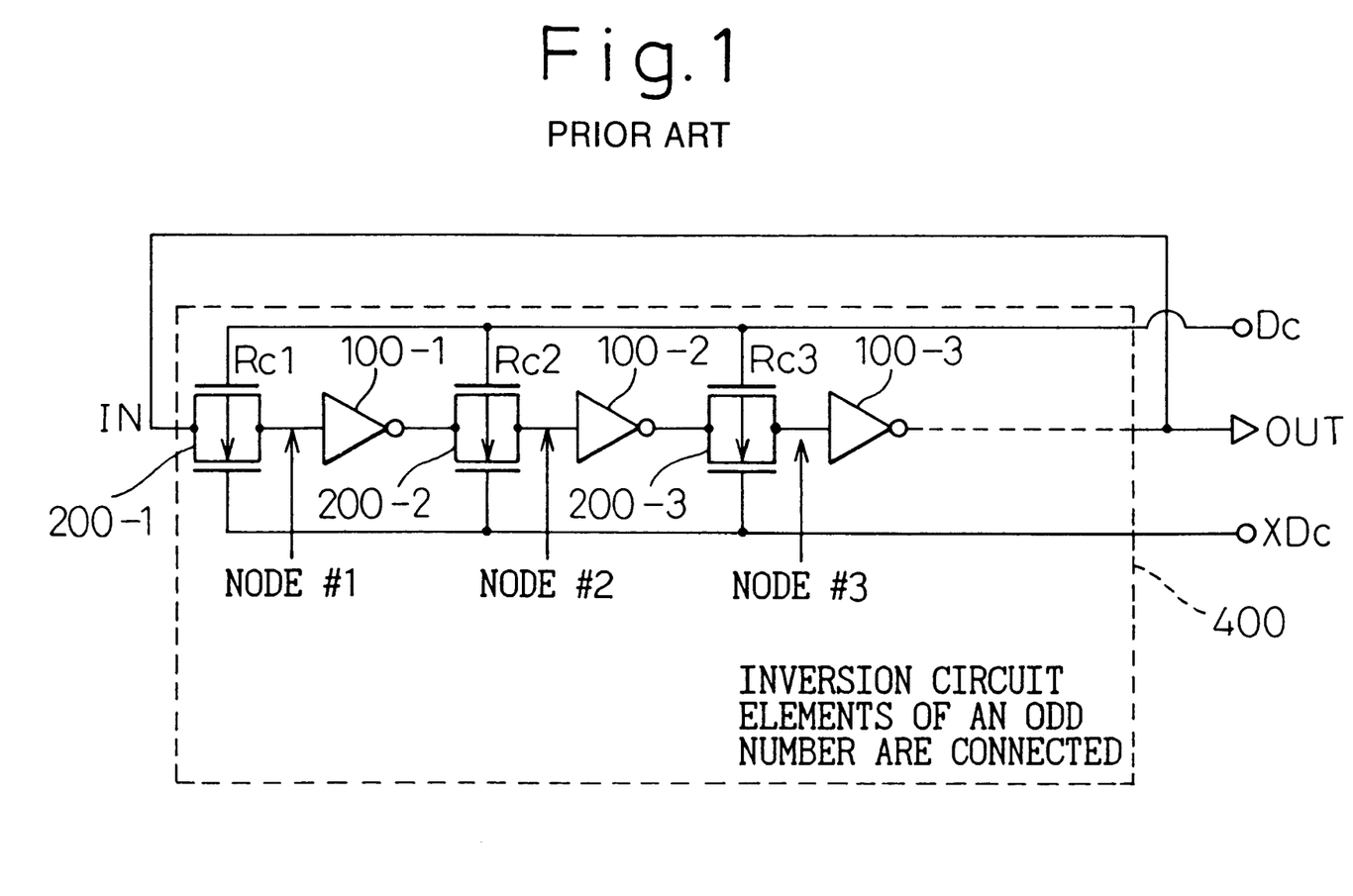
FIG. 1 is a circuit diagram showing an example of a conventional voltage controlled oscillation circuit.
Figure 2:
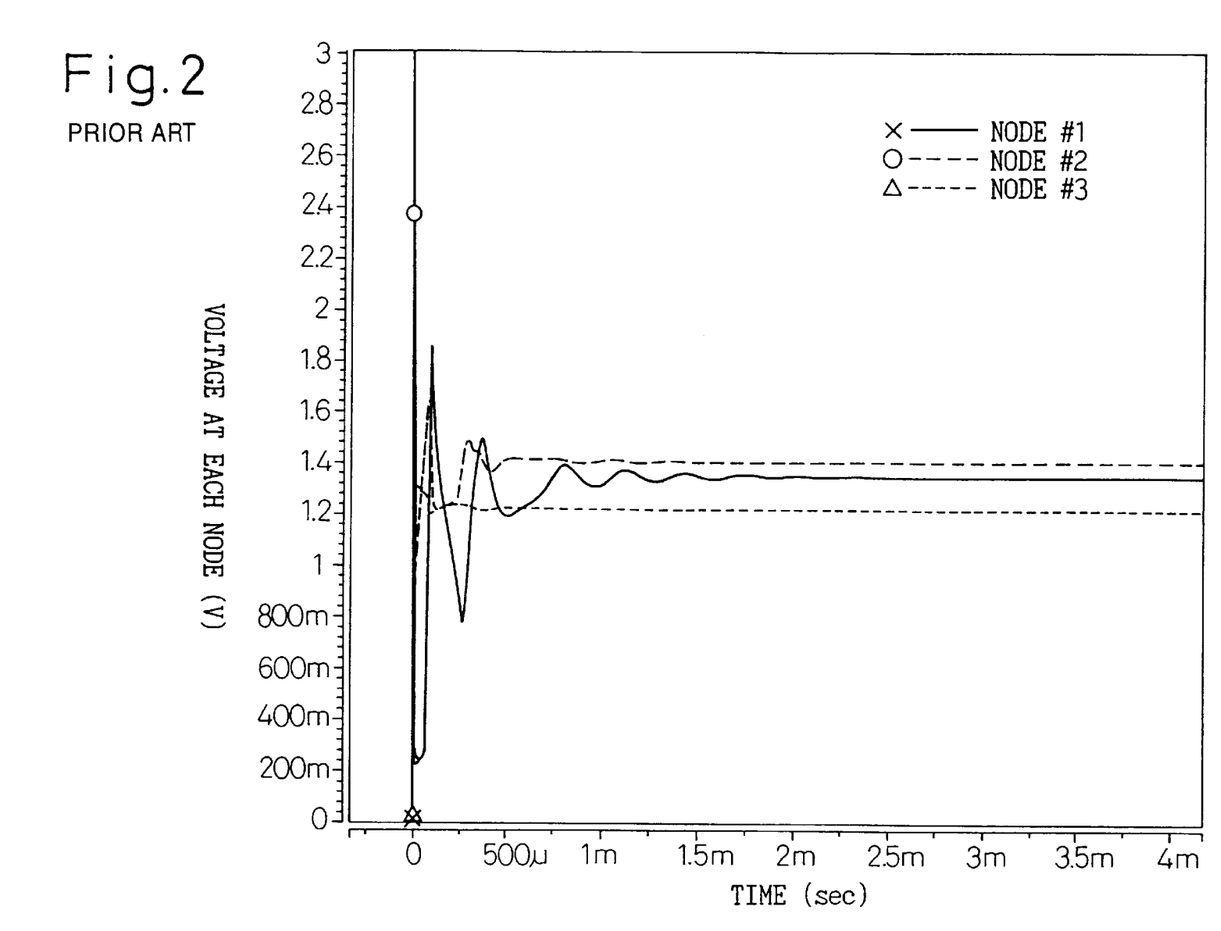
FIG. 2 is a graph showing a change with respect to time of the voltage across each node when the input voltage is reduced to 0 V or reaches a power source voltage according to the conventional circuit shown in FIG. 1.

In FIG. 1, a ring oscillation circuit including three inverters in series is shown as an example of a representative conventional voltage controlled oscillation circuit.

In a conventional voltage controlled oscillation circuit 400 shown in FIG. 1, three inverters i.e., first to third inverters 100-1 to 100-3, are connected in series each having the function of an inversion circuit element for inverting an output signal with respect to an input signal. An output terminal OUT of the third-stage inverter 100-3 is connected to the input terminal IN of the first-stage inverter 100-1. Thus, a ring circuit is configured in which an oscillation is caused by feeding back the output signal of the third-stage inverter to an input side of the first-stage inverter.

Further, in FIG. 1, first to third transfer gates 200-1 to 200-3 having the function of a frequency variable control unit for changing an oscillation frequency of the ring oscillation circuit are interposed between the respective adjacent inverters (including the pair of the third-stage inverter and the first-stage inverter) in the ring oscillation circuit. Each of the first to third transfer gates 200-1 to 200-3 includes a p-MOS transistor (p-channel type MOS transistor) and n-MOS transistor (n-channel type MOS transistor) connected in parallel. The gate of the p-MOS transistor and the gate of the n-MOS transistor are supplied with two types of analog control voltages Dc and XDc (the control voltages Dc and XDc are in an inverted relationship with respect to each other) through two control voltage terminals from an external source, thereby making it possible to change the oscillation frequency of the ring oscillation circuit. In other words, in accordance with the control voltages DC and XDc applied to the gate of the p-MOS transistor and the gate of the n-MOS transistor, respectively, the impedances of the first to third transfer gates 200-1 to 200-3 are changed, and thereby the same state is realized as if the input side of the first to third inverters 100-1 to 100-3 is connected with equivalent variable resistors Rc1, Rc2 and Rc3, respectively, so that the oscillation frequency of the ring oscillation circuit is made variable.

In the conventional voltage controlled oscillation circuit shown in FIG. 1, the impedance of the first to third transfer gates 200-1 to 200-3 inserted between the inversion circuit elements may increase, in the case in which the input voltage of the inversion circuit elements in the oscillation circuit is reduced to 0 V, or rises to a power source voltage level, at the time of switching on power, or when the reference clock is suspended for a long time at the time of using the PLL oscillator. More specifically, in the case in which the control voltages Dc and XDc applied to the gate of the p-MOS transistor and the n-MOS transistor of each transfer gate reach the voltage level near the power source voltage and the voltage level of 0 V, respectively, as shown in a graph of FIG. 8 described later, the resistance value of the equivalent variable resistors Rc1, Rc2 and Rc3 generated by the transfer gates considerably increases, typically, to the order of a giga ohm (G$\Omega$;$10^9\Omega$).

Let the transfer gates be in a high impedance state, as described above. As is apparent from the graph of FIG. 2 showing a temporal change of the voltages of nodes #1, #2 and #3 (FIG. 1) in the conventional voltage controlled oscillation circuit, oscillation lasts only for a small length of time (say, approximately 500 $\mu$sec) when a power source voltage rises sharply at the time of switching on power. The oscillation amplitude gradually decreases, however, and finally dies out. In other words, as long as each transfer gate remains at high impedance, the voltage level at each of the nodes #1, #2 and #3 positioned between the adjacent inverters cannot be inverted, and they therefore settle to an intermediate potential (say, 1.4 to 1.5 V). Even when power is switched on and rises, therefore, the oscillation fails to begin in the oscillation circuit unless the input voltage reaches a predetermined level.

The resulting problem of the conventional voltage controlled oscillation circuit is that it takes a long time before the oscillation starts in the oscillation circuit. Further, this problem leads to the adverse effect of lengthening the time (i.e., the lockup time) before a predetermined oscillation frequency is obtained in the analog PLL oscillator using the voltage controlled oscillation circuit of the above-mentioned type.

SUMMARY OF THE INVENTION

The present invention has been developed in view of the above-mentioned problem, and the object thereof is to provide a voltage controlled oscillation circuit in which a stable oscillation is guaranteed even in the case in which the input voltage level is reduced to 0 V or reaches the power source voltage level at the time of switching on power or using the PLL oscillator.

In order to solve the above-mentioned problem, according to the present invention, there is provided a voltage controlled oscillation circuit comprising an odd number of inversion circuit elements connected in series for inverting the output signals thereof with respect to the input signals thereto and having an output side of the last-stage inversion circuit element connected to an input side of the first-stage inversion circuit element thereby to cause an oscillation, a plurality of oscillation frequency variable control units inserted between the adjacent ones of the inversion circuit elements, respectively, for changing an oscillation frequency related to the oscillation in accordance with an external voltage, and a plurality of fixed resistor circuit elements each having a predetermined fixed resistance value connected in parallel with the oscillation frequency variable control units, respectively.

According to one preferred aspect of the invention, there is provided a voltage controlled oscillation circuit, in which each of the oscillation frequency variable control units includes a variable resistor circuit element having a variable resistor of a resistance value changing with the external voltage and in which the oscillation frequency is determined based on the resistance value of the variable resistors.

According to another preferred aspect of the invention, there is provided a voltage controlled oscillation circuit, in which each of the fixed resistor circuit elements includes at least one fixed resistor.

According to still another preferred aspect of the invention, there is provided a voltage controlled oscillation circuit, in which each of the fixed resistor circuit elements includes at least one MOS transistor, and in which a resistor having the above-mentioned fixed resistance value is realized by applying a predetermined voltage to the MOS transistor.

According to still another preferred aspect of the invention, there is provided a voltage controlled oscillation circuit, in which each of the fixed resistor circuit elements includes at least one polycrystalline silicon element formed on a substrate or the like, by which a resistor having the above-mentioned fixed resistance value can be realized.

According to still another preferred aspect of the invention, there is provided a voltage controlled oscillation circuit, in which each of the fixed resistor circuit elements includes at least one diffusion layer embedded in a substrate or the like, by which a resistor having the above-mentioned fixed resistance value can be realized.

Further, preferably, there is provided a voltage controlled oscillation circuit, in which an odd number of inversion circuit elements for inverting output signals thereof with respect to input signals thereof are connected in series with each other, in which an output side of the last-stage inversion circuit element is connected to an input side of the first-stage inversion circuit element for causing an oscillation, in which a plurality of transfer gates each including a MOS transistor are inserted between the respective adjacent inversion circuit elements, respectively, for changing an oscillation frequency related to the oscillation in accordance with an external voltage, and in which the MOS transistor is a depletion type transistor so that the oscillation is maintained by keeping the MOS transistor turned on even when the gate voltage is not applied to the MOS transistor.

Further, preferably, there is provided a voltage controlled oscillation circuit, in which an odd number of inversion circuit elements for inverting output signals thereof with respect to input signals thereof are connected in series to each other, in which an output side of the last-stage inversion circuit element is connected to an input side of the first-stage inversion circuit element thereby to cause an oscillation, in which a plurality of transfer gates each including a MOS transistor for changing an oscillation frequency related to the oscillation in accordance with an external voltage are inserted between adjacent ones of the inversion circuit elements, respectively, and in which the MOS transistor is a transistor of a short channel type having a short channel length so as to maintain the oscillation by keeping the MOS transistor turned on even when the gate voltage is not applied to the MOS transistor.

In a voltage controlled oscillation circuit according to the present invention, a plurality of fixed resistor circuit elements each having a predetermined fixed resistance value are inserted between a plurality of the inversion circuit elements in parallel with a plurality of transfer gates including a plurality of variable resistor circuit elements for changing the oscillation frequency. In the case in which power is switched on or the oscillation is temporarily suspended, and when the power input voltage level is reduced to 0 V or reaches the power source voltage level resulting in an increased impedance of each transfer gate, the combined resistance on the input side of each inversion circuit element is controlled by the fixed resistance value of the fixed resistor circuit elements. Consequently, even in the case in which the input voltage level is reduced to 0 V or reaches the power source voltage level, a stable oscillation is maintained in the oscillation circuit.

BRIEF DESCRIPTION OF THE DRAWINGS

The above object and features of the present invention will be more apparent from the following description of the preferred embodiments with reference to the accompanying drawings, wherein.

DESCRIPTION OF THE PREFERRED EMBODIMENTS

A basic embodiment and several preferred embodiments of the present invention will be described below with reference to FIGS. 3 to 9 of the accompanying drawings.

Figure 3:
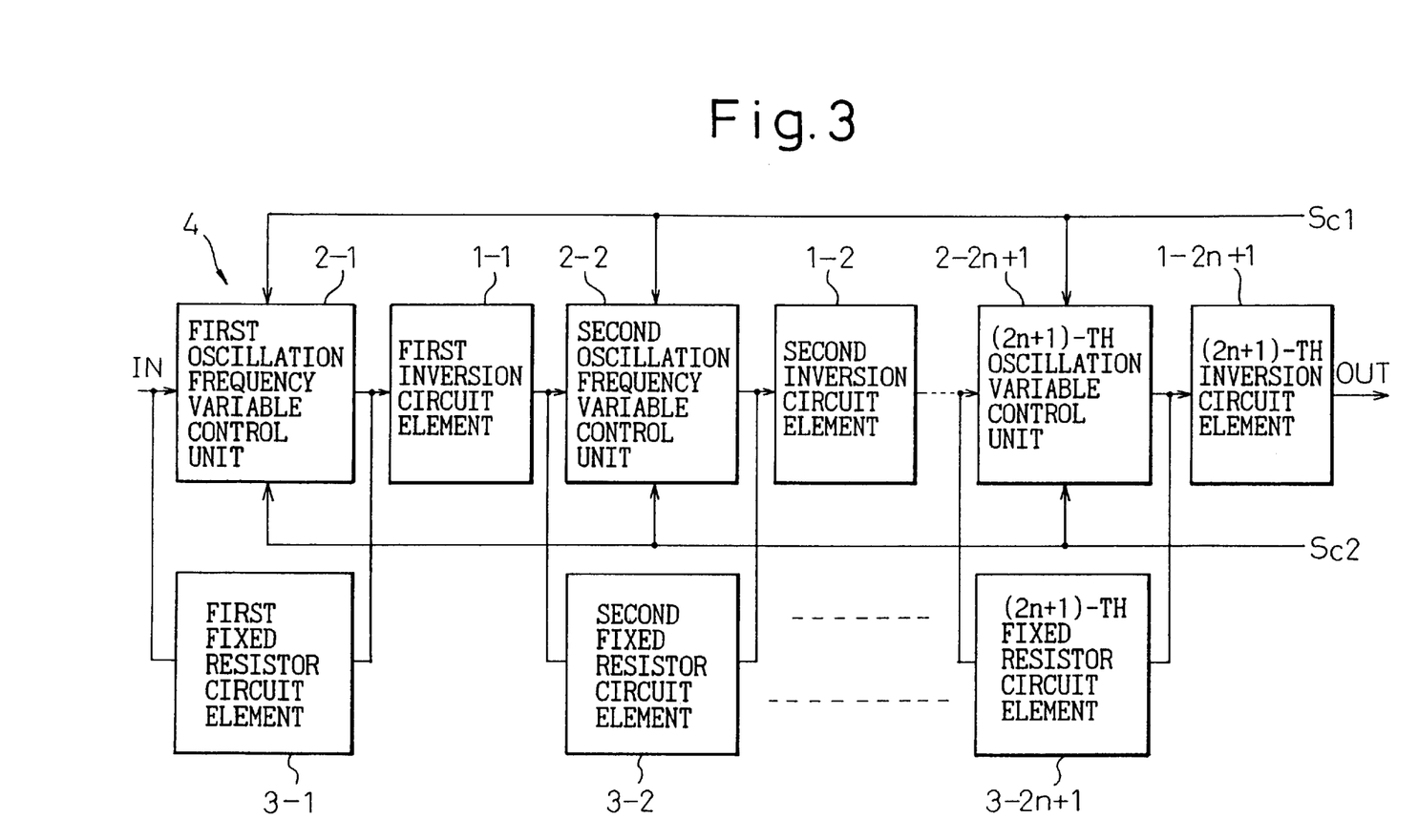
FIG. 3 is a block diagram showing a configuration of a basic embodiment conforming to the principle of the present invention.

FIG. 3 is a block diagram showing a configuration of a basic embodiment conforming to the principle of the invention. A configuration of a voltage controlled oscillation circuit 4 is shown in a simplified form.

The voltage controlled oscillation circuit 4 according to the basic embodiment of the invention, as shown in FIG. 3, comprises an odd number (1st to (2n+1)-th, where n is an integer number) of inversion circuit elements 1-1 to 1-(2n+1) connected in series for producing an output signal inverted from an input signal thereto, the output side of the last-stage one of the odd number of the inversion circuit elements being connected to the input side of the first-stage one of the odd number of the inversion circuit elements thereby to cause an oscillation, and a plurality of (1st to (2n+1)-th) oscillation frequency variable control units 2-1 to 2-(2n+1) inserted between adjacent ones of the inversion circuit elements, respectively, for changing the oscillation frequency in accordance with an external voltage (say, two types of control signal voltages Sc1 and Sc2).

The voltage controlled oscillation circuit according to the basic embodiment of the present invention further comprises a plurality of (1st to (2n+1)-th) fixed resistor circuit elements 3-1 to 3-(2n+1) each having a predetermined fixed resistance value connected in parallel with the frequency variable control units, respectively.

In the conventional voltage controlled oscillation circuit described above (FIG. 1), the first to third inverters 100-1 to 100-3 represent an example of the first to the (2n+1)-th inversion circuit elements 1-1 to 1-(2n+1) in the voltage controlled oscillation circuit (FIG. 3) according to the basic embodiment of the invention, and the first to third transfer gates 200-1 to 200-3 in the conventional voltage controlled oscillation circuit represent an example of the first to the (2n+1)-th oscillation frequency variable control units 2-1 to 2-(2n+1) of the voltage controlled oscillation circuit according to the basic embodiment of the invention. It should be noted, however, that a plurality of the fixed resistor circuit elements 3-1 to 3-(2n+1) included in the voltage controlled oscillation circuit according to the basic embodiment of the invention are not included in the conventional voltage controlled oscillation circuit.

Preferably, in the voltage controlled oscillation circuit according to the basic embodiment of the invention, each of the frequency variable control units is configured of a variable resistor circuit element including a variable resistor having a resistance variable in accordance with an external voltage, and the oscillation frequency is determined based on the resistance value of the variable resistor.

Also, preferably, in the voltage controlled oscillation circuit according to the basic embodiment of the invention, each of the fixed resistor circuit elements includes at least one fixed resistor.

Again, preferably, in the voltage controlled oscillation circuit according to the basic embodiment of the invention, each of the fixed resistor circuit elements includes at least one MOS transistor, and a resistor having the above-mentioned fixed resistance value is realized by applying a predetermined voltage to the MOS transistor.

Further, preferably, in the voltage controlled oscillation circuit according to the basic embodiment of the invention, each of the fixed resistor circuit elements includes at least one polycrystalline silicon element formed on a substate or the like, and a resistor having the above-mentioned fixed resistance value can be realized by this polycrystalline silicon element.

Further, preferably, in the voltage controlled oscillation circuit according to the basic embodiment of the invention, each of the fixed resistor circuit elements includes at least one diffusion layer embedded in a substrate or the like, and a resistor having the above-mentioned fixed resistance value can be realized by this diffusion layer.

In the voltage controlled oscillation circuit according to the basic embodiment of the invention, a plurality of fixed resistor circuit elements, each having a predetermined fixed resistance value, are inserted between a plurality of inversion circuit elements in parallel with a plurality of transfer gates, or the like, each including a variable resistor circuit element for changing the oscillation frequency. In the case in which the oscillation is temporarily stopped or power is switched on, and when the input voltage level is reduced to 0 V or reaches the power source voltage thereby to increase the impedance of each transfer gate, the combined resistance on the input side of each inversion circuit element can be controlled by the fixed resistance value of the fixed resistance circuit elements. As a result, the oscillation in the oscillation circuit is maintained in stable fashion even in the case in which the input voltage level is reduced to 0 V or reaches the power source voltage level.

Figure 4:
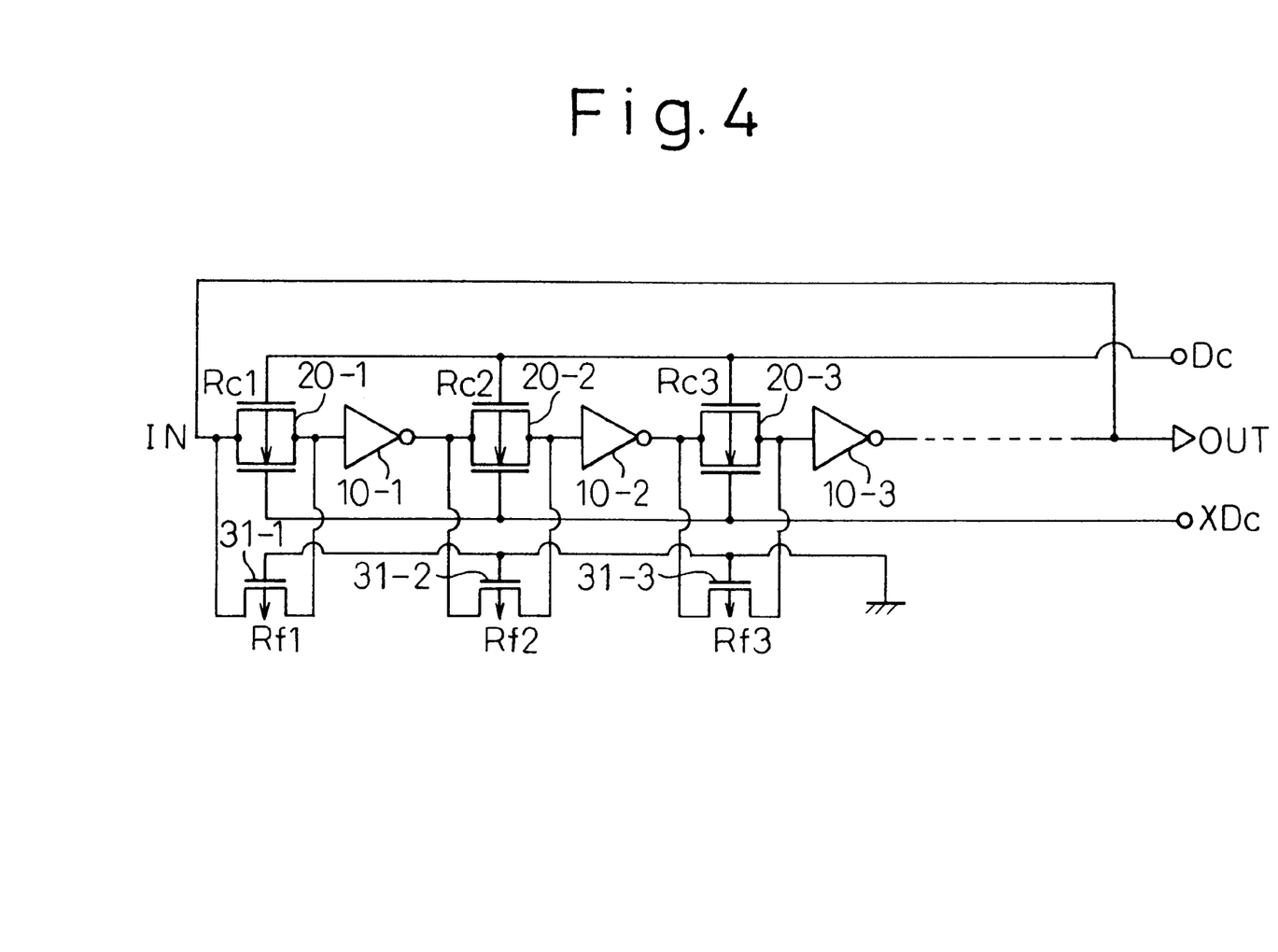
FIG. 4 is a circuit block diagram showing a configuration of a first preferred embodiment of the present invention.

FIG. 4 is a circuit block diagram showing a configuration of a first preferred embodiment of the present invention. A three-stage ring oscillation circuit is illustrated as a voltage controlled oscillation circuit configured as an odd number of inversion circuit elements connected in series. In the description that follows, the component elements identical to those described above will be designated by the same reference numerals, respectively.

In the first preferred embodiment shown in FIG. 4, a ring oscillation circuit is shown in which three inverters, i.e, first to third inverter 10-1 to 10-3 of a type for producing an output signal inverted from the input signal thereto are connected in series as an odd number of inversion circuit elements (FIG. 3) making up a voltage controlled oscillation circuit. Further, the output terminal OUT of the third-stage inverter 10-3 is connected to the input terminal IN of the first-stage inverter 10-1, and the output signal of the third-stage inverter is fed back to the input terminal of the first-stage inverter thereby to generate an oscillation.

Furthermore, in FIG. 4, first to third transfer gates 20-1 to 20-3 making up a plurality of frequency variable control units (FIG. 3) of the above-mentioned voltage controlled oscillation circuit are inserted between adjacent inverters (also between the third-stage inverter and the first-stage inverter) in the ring oscillation circuit. Each of these transfer gates 20-1 to 20-3 each have the function of a variable resistor circuit element including a variable resistor having a resistance value variable in accordance with DC control voltages Dc and XDc supplied from an external source.

More specifically, each of the first to third transfer gates 20-1 to 20-3 includes a p-MOS transistor and a n-MOS transistor connected in parallel with each other. The gate of the p-MOS transistor and the gate of the n-MOS transistor are supplied with two types of analog control voltages, Dc and XDc, respectively, through two control voltage terminals from an external source, thereby making it possible to change the oscillation frequency of the ring oscillation circuit. In other words, the same situation is realized as if equivalent variable resistors Rc1, Rc2 and Rc3 were connected to the input sides of the first to third inverters 10-1 to 10-3, respectively, by changing the impedances of the first to third transfer gates 20-1 to 20-3 in accordance with the control voltages Dc and XDc applied to the p-MOS transistor gate and the n-MOS transistor, respectively.

Further, in FIG. 4, first to third fixed resistor type of transistors 31-1 to 31-3, having predetermined fixed resistance values, are connected in parallel with the first to third transfer gates 20-1 to 20-3, respectively, as a plurality of fixed resistor circuit elements (FIG. 3) constituting the component elements representing a feature of the present invention. Each of these fixed resistor type of transistors preferably includes a MOS transistor with the gate thereof impressed with a predetermined voltage (say, 0 V), thus realizing the same state as if equivalent fixed resistors Rf1, Rf2 and Rf3 were connected, respectively.

Now, the operation of a voltage controlled oscillation circuit according to this invention will be described in detail by comparing the circuit configuration of the above-mentioned prior art (FIG. 1) with that of the first preferred embodiment (FIG. 4).

In the conventional configuration shown in FIG. 1, assume that power is switched on or the oscillation is temporarily stopped. One of the control voltage terminals is supplied with a control voltage Dc having a source voltage level, and the other control voltage terminal is impressed with a control voltage XDc having the voltage level of 0 V. At this time, the resistance values of the variable resistors Rc1, Rc2 and Rc3 derived from the first to third transfer gates 200-1 to 20-3 assume a high value in the order of GΩ. Due to the variable resistor of this high resistance value, according to the prior art shown in FIG. 1, the voltage at each of nodes #1 to #3 positioned between the adjacent inverters is attenuated with respect to time and converges to a voltage level of approximately one half of the power source voltage. Therefore, no oscillation occurs.

According to the first preferred embodiment shown in FIG. 4, in contrast, each of the equivalent resistors inserted between the inverters have a combined resistance value, which is obtained by a combination of each of the variable resistors Rc1, Rc2 and Rc3 derived from the first to third transfer gates 20-1 to 20-3, and each of the fixed resistors Rf1, Rf2 and Rf3 derived from the first to third fixed resistor type of transistors 31-1 to 31-3. As a result, according to the first preferred embodiment, in the case in which one of the control voltage terminals is impressed with the control voltage Dc having a power source voltage level and the other control voltage terminal is supplied with the control voltage XDc having a 0 V level, the impedances of the first to third transfer gates 20-1 to 20-3 increase to such a high level that the equivalent resistors inserted between the inverters come to assume substantially the same resistance value as the fixed resistors Rf1, Rf2 and Rf3. Specifically, according to the first preferred embodiment, unlike the prior art, the equivalent resistors inserted between the inverters never come to assume a high resistance value in the order of GΩ.

As a result, even in the case in which the first to third transfer gates 20-1 to 20-3 assume a high impedance, oscillation can occur. In the case in which the control voltages Dc and XDc change to such an extent that the impedances of the first to third transfer gates 20-1 to 20-3 are reduced to a low level, i.e., in the case in which the resistance values of the variable resistors Rc1, Rc2 and Rc3 are reduced to a sufficiently low value, the resistance values of these variable resistors Rc1, Rc2 and Rc3 dominate the combined resistance values. As in the prior art, therefore, the variation in the oscillation frequency can be controlled using the first to third transfer gates 20-1 to 20-3.

Figure 5:
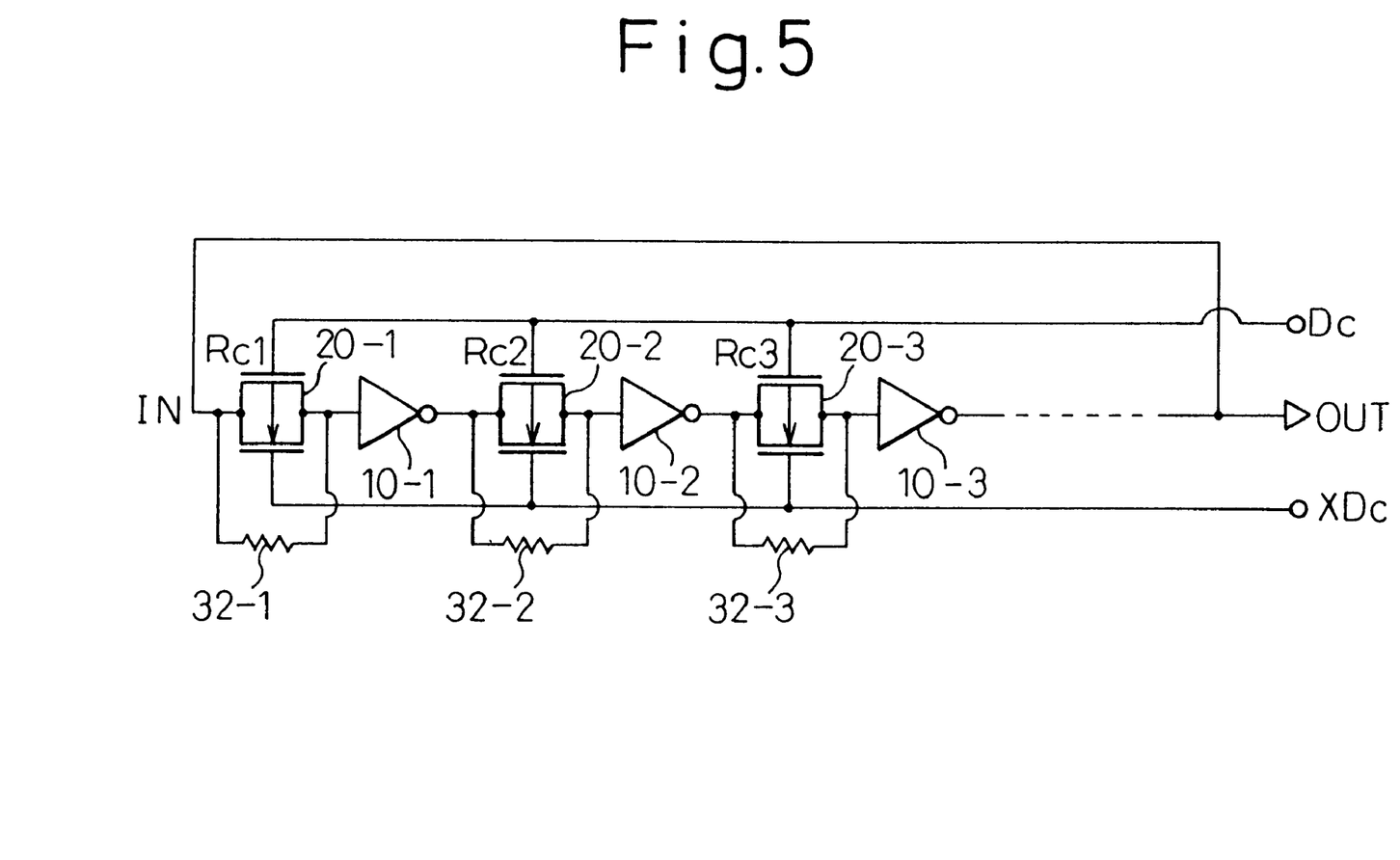
FIG. 5 is a circuit block diagram showing a configuration of a second preferred embodiment of the present invention.

FIG. 5 is a circuit block diagram showing a configuration of a second preferred embodiment of the present invention. In this case, too, a three-stage ring oscillation circuit is illustrated as a voltage controlled oscillation circuit comprising an odd number of inversion circuit elements connected in series.

In FIG. 5, the component elements of the first to third inverters 10-1 to 10-3 and the first to third transfer gates 20-1 to 20-3 are interconnected in a similar fashion to the corresponding component elements of first embodiment described above. The interconnections of the component elements, therefore, will not be described again.

According to the second preferred embodiment shown in FIG. 5, first to third fixed resistors 32-1 to 32-3 are connected in parallel with the first to third transfer gates 20-1 to 20-3, respectively, as a plurality of fixed resistor circuit elements (FIG. 3) constituting the feature of the component elements of the present invention. In this case, each of the equivalent resistors inserted between the inverters has a combined resistance value, which is obtained by a combination of the variable resistors Rc1, Rc2 and Rc3 derived from the first to third transfer gates 20-1 to 20-3, and each of the first to third fixed resistors 32-1 to 32-3.

As a consequence, according to the second preferred embodiment, in the case in which one of the control voltage terminals is supplied with a control voltage Dc having a source voltage level while the other control voltage terminal is supplied with a control voltage XDc having the voltage level of 0 V, each of the first to third transfer gates 20-1 to 20-3 assume a high impedance. The equivalent resistors inserted between the inverters, therefore, are controlled substantially by the fixed resistors 32-1 to 32-3. Specifically, according to the second preferred embodiment, as in the above-mentioned first embodiment, a high impedance state is not generated between the inverters and oscillation can be maintained even in the case in which the input voltage is 0 V.

In the voltage controlled oscillation circuit according to typical embodiments of the presert invention as described above, each of the fixed resistors 32-1 to 32-3 can be replaced with a polycrystalline silicon formed on a substrate to thereby realize a fixed resistor circuit element having a fixed-resistance value.

Further, in the voltage controlled oscillation circuit according to typical embodiments of the present invention as described above, each of the fixed resistors 32-1 to 32-3 can be replaced with a diffusion layer embedded in a substrate in a diffusion process to thereby realize a fixed resistor circuit element having a fixed resistance value.

Figure 6:
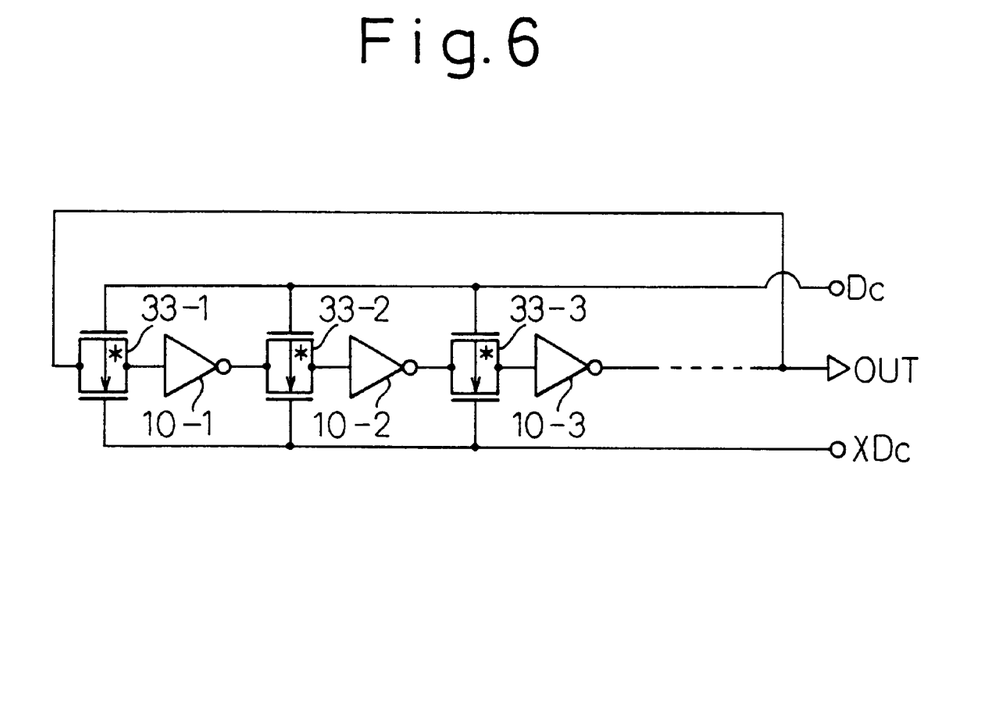
FIG. 6 is a circuit block diagram showing a configuration of a third preferred embodiment of the present invention.

FIG. 6 is a circuit block diagram showing a configuration according to a third preferred embodiment of the present invention. This embodiment also illustrates a three-stage ring oscillation circuit as a voltage controlled oscillation circuit comprising an odd number of inversion circuit elements connected in series.

The first to third inverters 10-1 to 10-3 in FIG. 6 have a configuration similar to the inverters according to the first and second embodiments described above. Therefore, the first to third inverters 10-1 to 10-3 will not be described again.

The third preferred embodiment shown in FIG. 6 includes first to third depletion type transistors or transistors of the short channel type (i.e., short channel type transistors) 33-1 to 33-3 as the MOS transistors making up the first to third transfer gates shown in the first to third embodiments described above. Here, to emphasize that the first to third depletion type transistors or transistors of the short channel type 33-1 to 33-3 shown in FIG. 6 have the below-mentioned specific characteristics different from the first to third transfer gates 20-1 to 20-3 shown in FIGS. 4 and 5, an asterisk (*) is added to each of the depletion type transistors or transistors of the short channel type 33-1 to 33-3.

In each of the depletion type transistors described above, a leak current or the like flows to keep the depletion type transistors active (i.e., in the on state) and therefore the oscillation can be maintained, even when a bias voltage is not applied to the gate thereof (for example, in the case in which a control voltage Dc having a power source voltage level is applied to one of the control voltage terminals, and a control voltage XDc having the voltage level of 0 V is applied to the other control voltage terminal).

On the other hand, each of the transistors of the short channel type has a channel shorter than an ordinary channel. Therefore, even when a voltage constituting a bias is not applied to the gate thereof, the leak current flows and keeps the transistor in the on state, thus making it possible to maintain the oscillation.

According to the third preferred embodiment shown in FIG. 6, each of the MOS transistors making up the first to third transfer gates for controlling the variation in the oscillation frequency of the voltage controlled oscillation circuit is comprised of a depletion type transistor or a transistor of the short channel type which does not assume a high impedance even when the input voltage thereto is 0 V. As a result, the same state can be realized without fixed resistor circuit elements as if fixed resistor circuit elements are inserted in parallel with variable resistor circuit elements. In other words, according to the above-mentioned third embodiment, the first to third depletion type transistors or transistors of the short channel type can carry out the dual function of the variable resistor circuit elements and the fixed resistor circuit elements. The circuit configuration, therefore, is simplified as compared with the first or the second embodiment described above.

Figure 7:
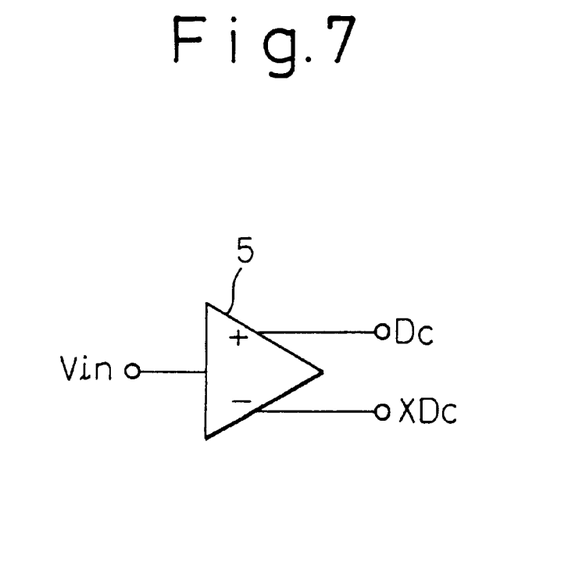
FIG. 7 is a circuit diagram showing an example of a circuit configuration for supplying an analog voltage for controlling an oscillation frequency of a voltage controlled oscillation circuit according to the present invention.

FIG. 7 is a circuit diagram showing an example of a circuit configuration for supplying an analog voltage for controlling the oscillation frequency of a voltage controlled oscillation circuit according to the present invention.

In FIG. 7, a control voltage generating circuit 5 including an amplifier such as an operational amplifier having a non-inverted output terminal and an inverted output terminal is provided as a circuit for supplying an analog voltage for controlling the oscillation frequency. This control voltage generating circuit 5 is so configured that upon application of an analog input voltage Vin thereto, two types of analog voltage having inverted polarities are output as a voltage for controlling the oscillation frequency. The two types of control voltages Dc and XDc used in typical embodiments of the present invention, for example, are supplied to the first to third transfer gates 20-1 to 20-3 from the above-mentioned non-inverted output terminal and the inverted output terminal. This control voltage generating circuit 5 can be packaged on the same substrate as the voltage controlled oscillation circuit according to this invention and thus can be incorporated into a single semiconductor integrated circuit or in a single LSI.

Figure 8:
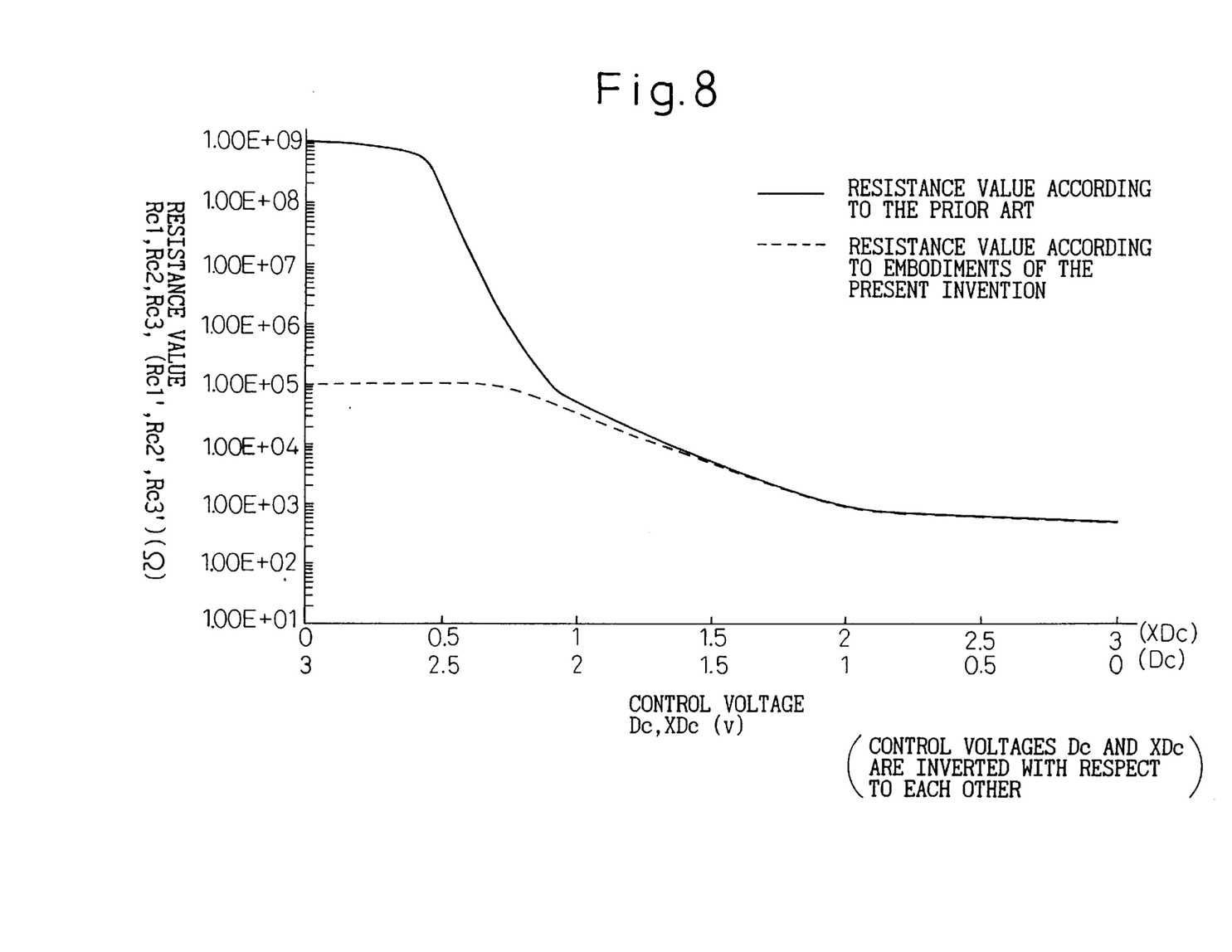
FIG. 8 is a graph showing the manner in which the resistance between the inverters changes according to typical embodiments of the present invention and according to the prior art.

FIG. 8 is a graph showing the manner in which the resistance changes between the inverters according to typical embodiments of the present invention and the prior art. This graph, however, as seen from the first and second embodiments described above, assumes a configuration in which a plurality of fixed resistor circuit elements are connected in parallel with a plurality of transfer gates, respectively.

In the conventional circuit shown in FIG. 1, when power is switched on or the oscillation is temporarily stopped, one of the two control voltage terminals (the terminal supplied with the control voltage XDc, for example) is supplied with the control voltage XDc having the voltage level of approximately 0 V and the other terminal (the terminal supplied with the control voltage Dc, for example) is supplied with the control voltage Dc having the power source voltage level (of, say, 3 V). At this time, the impedances of all three transfer gates increase to such high levels that each of the variable resistors Rc1, Rc2 and Rc3 derived from these transfer gates assumes a high resistance value in the order of G Ω (indicated by solid line in FIG. 8). As a result, the voltage across each of the nodes #1 to #3 between the inverters when the oscillation occurs in the circuit is attenuated with respect to time and converges to the voltage level of approximately one half of the power source voltage. The oscillation, therefore, is not maintained.

According to preferred embodiments of the present invention, in contrast, combined resistors Rc1', Rc2' and Rc3', each having the same resistance value as that produced in the case in which each of the three variable resistors Rc1, Rc2 and Rc3 derived from the three transfer gates is connected in parallel with each of the three equivalent fixed resistors Rf1, Rf2 and Rf3 (or the three fixed resistors 32-1 to 32-3) derived from the three fixed resistance type transistors, are inserted between the inverters. In this condition, assume that one of the two control voltage terminals is supplied with the control voltage XDc having a voltage level of approximately 0 V and the other voltage terminal is impressed with the control voltage Dc having the power source voltage level. The impedance of each of the first to third transfer gates increases to an extent shown by a dashed line in FIG. 8 and the combined resistors Rc1', Rc2' and Rc3' come to assume resistance values substantially equal to resistance values of the fixed resistors Rf1, Rf2 and Rf3, respectively.

Consequently, according to typical embodiments of the present invention, even in the case in which one of the control voltage levels is reduced to approximately 0 V, the resistance value of each of the combined resistors Rc1', Rc2' and Rc3' inserted between the inverters is prevented from increasing to a high value in the order of G Ω. In other words, the oscillation can occur even in the case in which the impedance of each of the first to third transfer gates increases to a high level.

Assume, on the other hand, that the voltage level of the control voltages Dc and XDc increases to such an extent that the impedance of each of the first to third transfer gates is decreased to a low level. In both the prior art and typical embodiments of the present invention, the combined resistors Rc1', Rc2' and Rc3' come to be controlled by the variable resistors Rc1, Rc2 and Rc3, respectively. As a result, the variation in the oscillation frequency can be controlled by using the first to third transfer gates.

Figure 9:
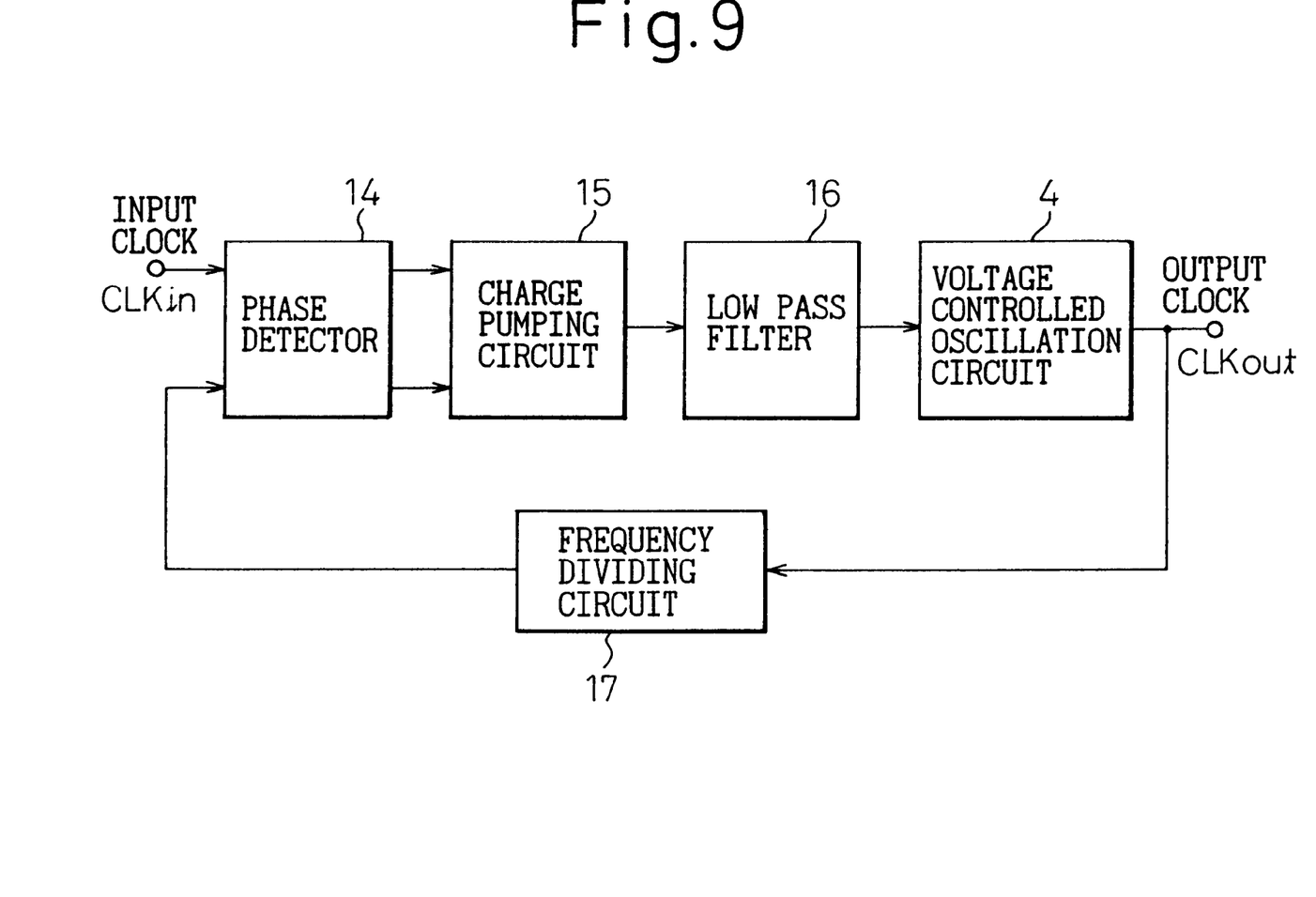
FIG. 9 is a block diagram showing a representative configuration of a PLL oscillator to which typical embodiments of the present invention are applied.

FIG. 9 is a block diagram showing a representative configuration of a PLL oscillator to which typical embodiments of the present invention is applied.

The analog PLL oscillator shown in FIG. 9 includes a phase detector 14, a charge pumping circuit 15, a low pass filter 16, a voltage controlled oscillation circuit according to the present invention (for example, the voltage controlled oscillation circuit 4 shown in FIG. 3) and a frequency dividing circuit 17. These component elements make up a control circuit in a control loop system.

The phase detector 14 has the function of detecting the phase difference between an input clock CLKin (such as a reference clock) and an oscillation output signal corresponding to an output clock CLKout of the voltage controlled oscillation circuit (or the frequency dividing circuit 17) according to the present invention.

The detection signal produced as a result of the phase detector 14 detecting the phase difference between the input clock and the oscillation output signal is applied to the charge pumping circuit 15. The charge pumping circuit 15 outputs a phase difference voltage corresponding to the phase difference between the input signal and the oscillation output signal.

The phase difference voltage output from the charge pump circuit 15, after being smoothed by the low pass filter 16, is applied to the voltage controlled oscillation circuit according to the present invention. This voltage controlled oscillation circuit generates an oscillation output signal having an oscillation frequency corresponding to the phase different voltage that has been smoothed. The oscillation output signal from this voltage controlled oscillation circuit is input to the phase detector 14 directly or after the oscillation frequency is adjusted into a phase-detectable value through the frequency dividing circuit 17.

The use of a voltage controlled oscillation circuit according to the present invention can stably maintain the oscillation without any interruption even when the input voltage to the voltage controlled oscillation circuit is reduced to 0 V as a result of a protracted suspension of the input clock or the like situation. It is thus possible to remarkably reduce the length of time from the point when the input clock is supplied again to the point when the oscillation frequency rises to a predetermined level in the PLL oscillator.

As described above, a first advantage of a voltage controlled oscillation circuit according to several representative embodiments of the present invention is that the oscillation can be maintained in stable fashion even when the input voltage is reduced to 0 V in view of the fact that a plurality of fixed resistor circuit elements having a fixed resistance value are connected in parallel to a plurality of oscillation frequency variable control units such as transfer gates, respectively, for changing the oscillation frequency in accordance with an external voltage. Consequently, a PLL oscillator using the above-mentioned voltage controlled oscillation circuit can prevent an increase in the time length required before rising to a predetermined frequency after power is switched on, thus making it possible to considerably reduce the rise time required to attain a stable oscillation of each single oscillator.

A second advantage of a voltage controlled oscillation circuit according to representative embodiments of the present invention is that, in view of the fact that a fixed resistor circuit element is connected in parallel with variable resistor circuit element constituting each of a plurality of oscillation frequency variable control units for changing the oscillation frequency in accordance with an external voltage, the resistance between the inversion circuit elements is prevented from increasing even in the case in which the input voltage is reduced to 0 V and the variable resistor circuit elements come to assume a high impedance. Consequently, even in the case in which the input voltage is reduced to 0 V, the fixed resistor circuit elements can carry out the function thereof to accomplish a stable oscillation.

A third advantage of a voltage controlled oscillation circuit according to representative embodiments of the present invention is that, in view of the fact that a fixed resistor is connected in parallel with each of a plurality of variable resistor circuit elements, the oscillation can be maintained in stable fashion by setting the resistance of the fixed resistor to a proper value even in the case in which the input voltage level is reduced to 0 V or reaches the power source voltage level at the time of switching on power or at the time of using a PLL oscillator.

A fourth advantage of a voltage controlled oscillation circuit according to representative embodiments of the present invention is that, in view of the fact that a MOS transistor having a fixed resistance value under a predetermined voltage is connected in parallel with each of a plurality of variable resistor circuit elements, the oscillation is maintained in stable fashion even in the case in which the input voltage level is reduced to 0 V or reaches the power source voltage level at the time of switching on power or at the time of using a PLL oscillator, and at the same time, the oscillation circuit can be realized with a single semiconductor integrated circuit.

A fifth advantage of a voltage controlled oscillation circuit according to representative embodiments of the present invention is that, in view of the fact that each of a plurality of fixed resistor circuit elements is realized by or polycrystalline silicon element having the fixed resistance value, the oscillation is maintained in stable fashion even in the case in which the input voltage level is reduced to 0 V or reaches the power source voltage level at the time of switching on power or at the time of using a PLL oscillator, and at the same time, each of the fixed resistor circuit elements using the polycrystalline silicon element can be easily assembled on a single substrate along with the semiconductor integrated circuit.

A sixth advantage of a voltage controlled oscillation circuit according to representative embodiments of the present invention is that, in view of the fact that each of a plurality of fixed resistor circuit elements is realized by a diffusion layer having the fixed resistance value embedded in a substrate, the oscillation is maintained in stable fashion even in the case in which the input voltage level is reduced to 0 V or reaches the power source voltage level at the time of switching on power or at the time of using a PLL oscillator, and at the same time, each of the fixed resistor circuit elements using the diffusion layer can be easily realized on a single substrate along with the semiconductor integrated circuit.

A seventh advantage of a voltage controlled oscillation circuit according to representative embodiments of the present invention is that, in view of the fact that the MOS transistor constituting each of a plurality of variable resistor circuit elements is a depletion type transistor, the transistor can be turned on even in the case in which a voltage providing a bias is not applied to the gate of the transistor. In this case, the depletion type transistor can carry out the dual function of a variable resistor circuit element and a fixed resistor circuit element, and therefore the oscillation can be maintained with a comparatively simple circuit configuration.

An eighth advantage of a voltage controlled oscillation circuit according to representative embodiments of the present invention is that, in view of the fact that the MOS transistor constituting each of a plurality of variable resistor circuit elements is a transistor of the short channel type, the transistor can be turned on even in the case in which a voltage providing a bias is not applied to the gate of the transistor. In this case, the transistor of the short channel type can carry out the dual function of a variable resistor circuit element and a fixed resistor circuit element, and therefore the oscillation can be maintained with a comparatively simple circuit configuration.

What is claimed is:

1. A voltage controlled oscillation circuit comprising:
   an odd number of inversion circuit elements connected in series with each other for inverting output signals thereof with respect to input signals thereto, an output side of the last-stage one of said inversion circuit elements being connected to an input side of the first-stage one of said inversion circuit elements for causing an oscillation;
   a plurality of oscillation frequency variable control units each inserted between corresponding adjacent ones of said inversion circuit elements for changing an oscillation frequency related to said oscillation in accordance with an external voltage; and a plurality of fixed resistor circuit elements each having a predetermined fixed resistance value connected in parallel with said oscillation variable control units, respectively, wherein each of the plurality of said oscillation frequency variable control units includes a variable resistor circuit element having a variable resistor of a resistance value which is variable in accordance with said external voltage, wherein said oscillation frequency is determined based on the resistance value of said variable resistor, and wherein, when a resistance value of each of the oscillation frequency control units becomes large to such a degree that oscillation would fail to occur in the absence of each of the plurality of fixed resistor elements the presence of each of the plurality of fixed resistor elements in the oscillation circuit function to maintain a stable oscillation in the oscillator circuit.

2. A voltage controlled oscillation circuit according to claim 1, wherein each of the plurality of said fixed resistor circuit elements includes at least one fixed resistor.

3. A voltage controlled oscillation circuit according to claim 1, wherein each of the plurality of said fixed resistor circuit elements includes at least one MOS transistor, and wherein a resistor of said fixed resistance value is realized by applying a predetermined voltage to said MOS transistor.

4. A voltage controlled oscillation circuit according to claim 1, wherein each of the plurality of said fixed resistor circuit elements includes at least one polycrystalline silicon element, and wherein a resistor having said fixed resistance value can be realized by said polycrystalline silicon element.

5. A voltage controlled oscillation circuit according to claim 1, wherein each of the plurality of said fixed resistor circuit elements includes at least one diffusion layer, and wherein said resistor having said fixed resistance value can be realized by said diffusion layer.

6. A voltage controlled oscillation circuit comprising:

an odd number of inversion circuit elements connected in series with each other for inverting output signals thereof with respect to input signals thereto, an output side of the last-stage one of said inversion circuit elements being connected to an input side of the first-stage one of said inversion circuit elements for causing an oscillation; and a plurality of transfer gates each including an MOS transistor inserted between each adjacent ones of said inversion circuit elements for changing an oscillation frequency related to said oscillation in accordance with an external voltage, wherein said MOS transistor is a depletion type transistor, and wherein said MOS transistor is turned on to thereby maintain said oscillation even in the case in which said MOS transistor is not impressed with a gate voltage.

7. A voltage controlled oscillation circuit comprising:

an odd number of inversion circuit elements connected in series with each other for inverting output signals thereof with respect to input signals thereto, an output side of the last-stage one of said inversion circuit elements being connected to an input side of the first-stage one of said inversion circuit elements for causing an oscillation; and a plurality of transfer gates each including an MOS transistor inserted between each adjacent ones of said inversion circuit elements for changing an oscillation frequency related to said oscillation in accordance with an external voltage.

wherein said MOS transistor is a transistor of a short channel type having a short channel length, and wherein said MOS transistor is turned on to thereby maintain said oscillation even in the case in which said MOS transistor is not impressed with a gate voltage.

* * * * *